United States Patent [19]
Smith

[11] Patent Number: 4,649,817
[45] Date of Patent: Mar. 17, 1987

[54] STENCIL MANUFACTURING AND PRINTING PROCESS

[76] Inventor: Michael S. Smith, 7256 Rte. 212, Saugerties, N.Y. 12477

[21] Appl. No.: 667,633

[22] Filed: Nov. 2, 1984

[51] Int. Cl.⁴ .......................... B41F 15/20; B41F 15/34
[52] U.S. Cl. .................................... 101/129; 101/126; 101/128.4
[58] Field of Search ............... 101/114, 115, 126, 127, 101/127.1, 128.1, 128.4, 129; 355/91, 93, 94

[56] References Cited

U.S. PATENT DOCUMENTS

| | | | |
|---|---|---|---|
| 2,239,619 | 4/1941 | Murgatroyd et al. | 101/115 |
| 3,150,583 | 9/1964 | Reed, III et al. | 95/77 |
| 3,172,358 | 3/1965 | Weiss | 101/126 |
| 3,221,648 | 12/1965 | Weiss | 101/129 |
| 3,221,649 | 12/1965 | Weiss | 101/126 |
| 3,372,638 | 3/1968 | Tripp | 101/114 |
| 3,463,587 | 8/1969 | Oltra et al. | 355/93 |
| 3,871,293 | 3/1975 | Valiela | 101/114 X |
| 3,964,385 | 6/1976 | Knight | 101/128.4 |
| 4,083,301 | 4/1978 | Black | 355/93 X |
| 4,388,862 | 6/1983 | Thomas, Jr. | 101/129 X |
| 4,484,813 | 11/1984 | Maher | 355/94 X |

OTHER PUBLICATIONS

*Screen Printing*, Feb., 1984, "Stencil Troubleshooting Chart".

Primary Examiner—J. Reed Fisher
Attorney, Agent, or Firm—Heslin & Rothenberg

[57] ABSTRACT

A stencil manufacturing and printing process reduces printed image distortion by matching screen deflection in the photostencil preparation phase with stencil deflection in the printing phase. The usual squeegee is replaced by atmospheric pressure and screen/stencil deflection is induced by producing a vacuum through a specially constructed air distribution frame. Compressed air can be introduced through the same frame to rapidly release the stencil from the substrate when the printing is completed. A control unit facilitates operator control of the printing process.

20 Claims, 7 Drawing Figures

STENCIL MANUFACTURING AND PRINTING PROCESS

BACKGROUND OF THE INVENTION

1. Technical Field

This invention relates, in general, to "silk screen" printing and more particularly to an improved process and new apparatus for manufacturing and printing with a stencil which provides greater accuracy and significantly reduced distortion.

2. Background Information

"Silk screen" printing is an old and well established art which employs a screen supported stencil to provide a dense and opaque layer of ink on a substrate. The name "silk screen" comes from the threads originally used to support the various individual elements of the stencil. Today, this printing process enjoys widespread commercial application and is used to print on such diverse items as dishes, dials, poster board, plexiglass sheets, textiles and silicon wafers. In the electronics industry the process is sometimes referred to as thick-film printing.

The process involves two phases: stencil manufacture and stencil printing. In the manufacture of a stencil, the screen fabric (now generally polyester, not silk) is stretched tightly across a stable frame to which it is adhered. This stretched screen is then coated with a photosensitive emulsion. A film positive, containing an opaque image on a clear film base of the art to be printed, is placed in contact with the bottom of the emulsion coated screen. Both are then placed in a vacuum frame consisting of a glass plate and a rubber blanket. Air is withdrawn from between the glass and the rubber sandwiching the screen and contiguous positive between the two. U.S. Pat. No. 3,463,587 illustrates such a vacuum frame used for preparing silk screen stencils.

The emulsion coated screen is photo exposed by beaming a strong light through the glass of the vacuum frame to harden all emulsion not masked from the light by the opaque lines of the film positive. The exposed screen is then removed from the vacuum frame to be dampened by a spray of water that dissolves all unhardened areas completing the stencil making process.

The stencil is now ready for printing. This generally requires, in addition to the ink and the substrate to be printed on, three basic appliances. The first is a table to support the stencil and the substrate to be printed on. The table is commonly perforated and attached to a vacuum to hold the substrate securely during the printing process. The second appliance is a hinge/clamp device that attaches the stencil frame to the table so that it may be raised and lowered to the exact same position each time a new substrate is placed on the table for printing. The third commonly used appliance is the squeegee, a resilient scraping device that spreads the ink across the back of the stencil and applies the pressure that causes the ink to pass through the stencil onto the substrate.

With these basic elements, a number of complex mechanisms have been constructed. These include the hand-operated, semi-automatic, three-quarter automatic, fully automatic, as well as cylinder and rotary screen printers. With the exception of the highly specialized rotaries, these prior printers all generally utilize the frame stretched stencil and the squeegee. The cylinder press has a drum bed (table) instead of a flat bed and its stencil reciprocates in a motion with the drum bed instead of hinging or rising to allow the replacement of a substrate.

In general, the screen printing process employs the following sequence of steps: after a register is determined and all adjustments have been made (called setup) an amount of ink is placed on the stencil outside of the image area, as wide as the image, and a squeegee slightly wider than the image is placed behind the ink, pressed down and moved with even pressure across the image area forcing the ink through the open stencil spaces and onto the substrate. The screen is then lifted and the ink is pushed back over the image area with little pressure returning it to the point of origin and "flooding" the screen in the process. While the screen is raised, the substrate is released and removed for drying and another substrate is placed in registry on the table so the sequence can begin again.

With the exception of rotary screen printers, the sequence described above is generally used by all mechanisms that use a screen/stencil for printing. Variations may occur as system options such as flood bars that return the ink by lifting and carrying it instead of coating the image area; or, as in the case of the cylinder press, a stationary squeegee may be made to traverse the image area by moving the stencil and the bed in unison relative to a stationary squeegee. This same variation is used when cylindrical objects such as bottles or glasses are stencil printed. On the whole, though, adaption or modification of the individual characteristics of the basic sequence does not change the function of the sequence. The ink is still forced through a frame-supported stencil by a squeegee to produce the desired impression.

A brief description of some basic characteristics of screens and the screen/stencil printing process is helpful in understanding the wide application of this technology. First, the screens that support the stencils are woven in a range of fineness from as coarse as 16 threads per inch, with a thread thickness of 0.0138 inches to as fine as 1635 threads per inch with a thread thickness of 0.0008 inches. Since the emulsion coating completely encapsulates the screen and the ink is deposited relative to the emulsion thickness, the thickness of the impression from the stencil is equal to a calculable amount based on the thread thickness and the ink film thickness after drying. In applications such as electronic circuit printing or plating and solder resist printing, this ability to control film thickness for functional purposes is a practical and economic use of stencil printing.

The nature of this printing technique also contributes to its wide application. In its most basic form, screen/stencil printing requires nothing more than a screen supported stencil and squeegee to produce an impression. No mechanism to actuate pressure is needed. For this reason, stencils may print virtually any size without requiring a machine of corresponding dimension. It is only necessary to be able to sufficiently contact the object to be printed. The impression is made by fluid pressure of the ink and the surface attraction of the material under the stencil. Thus screen/stencil printing is versatile enough to print on large, solid objects and minute, delicate objects with virtually the same pressure.

Together, these characteristics make "silk screen" printing a unique printing process fulfilling product demands that establish it as an essential technology in contemporary manufacturing. Nevertheless, the existing process suffers from significant limitations; the most notable of which is image distortion.

The inventor has identified two primary sources of printed image distortion occurring in the existing screen/stencil printing process. The first arises from the use of a squeegee transversing a stencil to apply an image to a substrate. When this instrument is drawn across the stencil-supporting screen fabric an amount of friction-produced stretch and accompanying image elongation is inevitable. Further, the sqeegee produces undesirable vibration, and static electricity. The latter can attract dust and other particles in the air producing a glitch in the printed image.

The second principal source of distortion arises because the stencil must be supported a slight distance above the substrate in the printing stage to permit the necessary "peel" of the stencil behind the squeegee that assures good edge definition in the printed image; while, in the photoexposure process, the screen frame is held in planar contact with the glass during the vacuum hold. Since the image is exposed at one level and deflected to another for printing, an additional degree of distortion is also inevitable.

Attempts have been made in the past to eliminate the squeegee from the stencil printing process. See for example, U.S. Pat. Nos. 3,172,358, 3,221,648 and 3,221,649 to F. Weiss. These patented devices employ a vacuum induced through the printing bed to suck ink through the stencil and onto a substrate. This process, however, appears to require a porous substrate which must be prewet with solvent. These requirements coupled with the convex printing bed and the absence of any mechanism for quickly releasing the stencil from the substrate, makes this apparatus unsuitable for fine, close tolerance, printing applications. Note further that there is no recognition in these patents of the second principal source of image distortion discussed above and that the patented structure is inherently incapable of addressing the second problem.

U.S. Pat. No. 3,964,385 is directed to a "Unitary Device and Method For Screen Manufacture and Printing" but fails to recognize and redress the image distortion problems discussed above.

When close tolerances and minimum distortion are required in the screen printing process, for example, in electronics applications, a number of cumbersome procedures have been employed to overcome the distortion problems. These have entailed much time consuming analysis and art modification. A need thus persists for a stencil printing process and apparatus which can effectively overcome the above described drawbacks of the existing technology.

SUMMARY OF THE INVENTION

Briefly, the present invention satisfies this need by totally eliminating the squeegee from the printing process and employing the screen/stencil as a diaphragm which is equally deflected in the stencil manufacturing and stencil printing stages. Through the selective application of vacuum pressure, the image area of the screen is deflected to contact the film positive in the stencil manufacturing process and the ink bearing stencil is equally deflected to contact the substrate in the stencil printing process. Use of the same air distribution frame to induce both deflections assures precise control over image stability. The invention also contemplates use of a special screen finishing process in the stencil manufacturing phase, and of a unique control unit and compressed air stencil release mechanism in the printing phase, all designed to further facilitate rapid, accurate and distortion free printing.

Accordingly, a principal object of the invention is to provide a method and apparatus which eliminates the primary sources of image distortion in stencil printing.

Another object of the invention is to provide a stencil preparation and printing process and apparatus which is simple, versatile and cost effective as well as precise and controllable.

Yet another object is to provide such a process and apparatus which eliminates the disadvantages associated with a squeegee while improving the accuracy and image stability of the final printed image.

A further object of the invention is to provide a new and unique approach to "silk screen" printing which correlates and integrates the stencil preparation and stencil printing phases to reduce final image distortion.

A still further object is to provide a screen/stencil supporting frame which also serves an air distribution function and can be employed to selectively and controllably deflect the screen or stencil supported by the frame.

Another object is to provide a stencil supporting, air distribution frame which can easily be constructed from readily available materials, in varying sizes, and advantageously employed in a wide variety of screen printing applications to print on diverse objects.

Yet another object of the invention is to provide a special screen finishing process, printing process control unit and stencil rapid release mechanism and other refinements which further facilitate close tolerance, substantially distortion free printing.

Still another object is to provide improvements in both the stencil preparation and stencil printing processes which when integrated produce a superior process and product.

Another object is to provide apparatus for implementing the improved processes which can be embodied as an add-on to existing thick film or flat bed screen printers to upgrade that equipment for greater precision and higher production rates.

These and other objects, advantages and features of the invention will be more readily apparent from the following detailed description taken in conjunction with the accompanying drawings in which:

DETAILED DESCRIPTION

Although departing in several fundamental respects from existing practice, the present invention follows the general steps of the "silk screen" process described previously. For purposes of discussion, it is convenient to divide this process into a stencil preparation or manufacturing phase and a stencil printing phase. Previously these phases have generally been considered as separate independent and unrelated processes. The present invention is unique in that it correlates and integrates these two phases by matching screen deflection occurring in the photostencil preparation phase with the stencil deflection of the printing phase. This is optimally accomplished through the use of a common vacuum inducing, screen/stencil supporting frame, hereinafter sometimes referred to as an air distribution frame.

Figure 1:
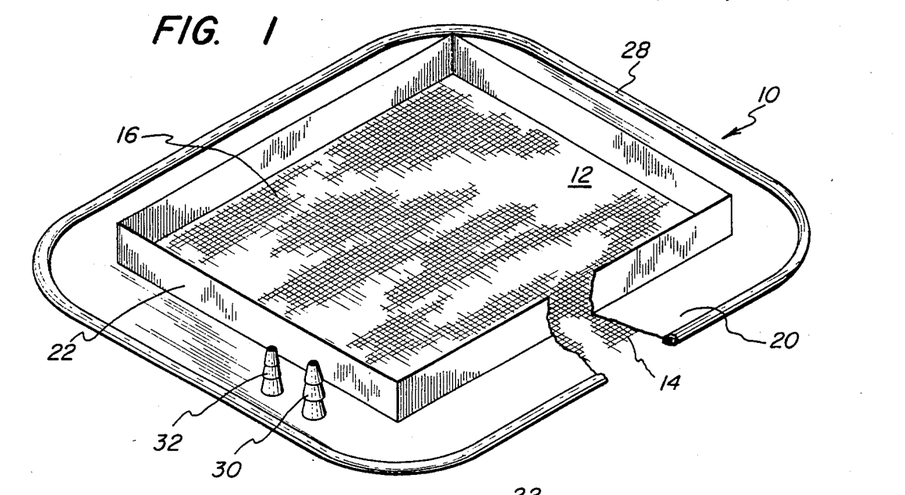
FIG. 1 is a perspective view from the top of the air distribution frame (partially cut away) of the present invention.

A presently preferred embodiment of the air distribution frame of the present invention is depicted in perspective view in FIG. 1. As illustrated in this Figure, air distribution frame 10 is of generally rectangular configuration. Frame 10 surrounds a central opening 12 across which a screen 14 may be tautly stretched in a manner well known in the art. Screen 14 is peripherally secured to the underside of frame 10 as illustrated in the cut-away view on the right side of FIG. 1. Stretched screen 14 may be adhered to frame 10 by tape, adhesive or any other suitable means. The bond between the screen and frame should be sufficiently strong to allow for repeated deflection of screen 14 out of a first plane in which it is normally held by the frame. Screen 14 includes an image area 16 overlying at least a portion of central opening 12. Image area 16 which may be of any desired size and shape is generally coextensive with the source artwork.

Figure 2:
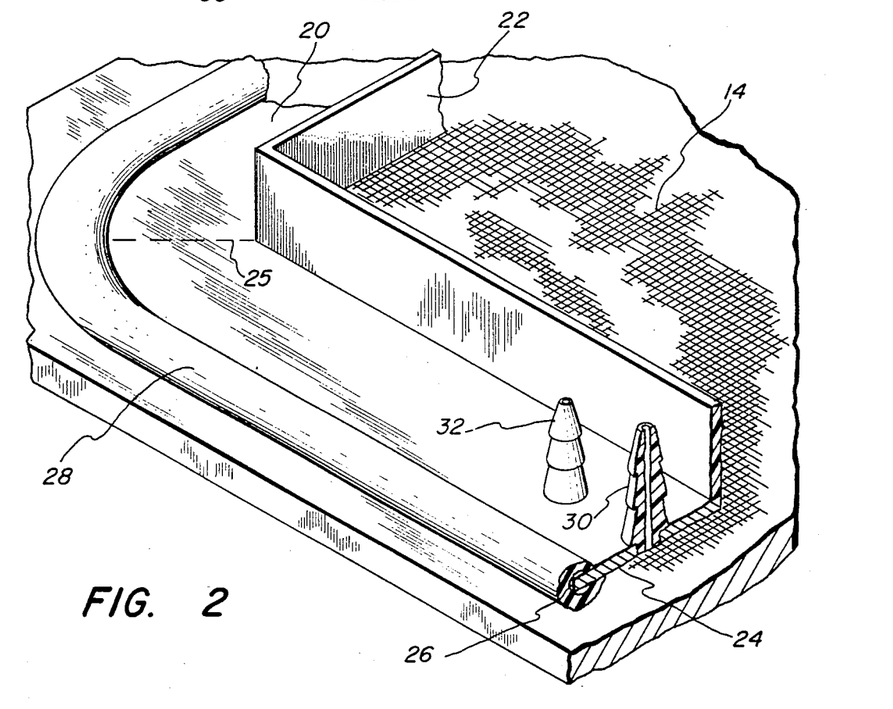
FIG. 2 is a cut-away side view of a portion of the frame resting on a supporting surface.

Referring now to both the top view of FIG. 1 and the cut-away side view of FIG. 2, frame 10 preferably includes a first frame member 20 extending around and away from central opening 12 and an upright second frame member 22. The frame is thus, preferably, of angular cross section with the lower edge of second frame member 22 adjacent the inner edge of first frame member 20, and the frame members meeting at substantially 90°.

The frame may be constructed of angle iron cut to length and mitered (as illustrated by dashed line 25 in FIG. 2) to form a frame of any desired size and shape. Alternatively the frame may be of a unitary construction formed by casting or other known techniques. The frame is preferably made of lightweight, strong material such as aluminum or plastic which retains its structural integrity when formed and employed as a screen supporting structure.

First frame member 20, in effect, defines a continuous peripheral band extending around central opening 12. The lower surface 24 of frame member 20 provides the mounting surface for screen 14. Outer edge 26 of frame member 20 preferably serves as a mounting rim for a peripheral gasket 28. The nominal outer corners of frame member 20 are radiused to an even curvature thereby facilitating the attachment of gasket 28 to the outer cornerless border of the band defined by frame member 20. Gasket 28 may comprise slit soft rubber or latex tubing suitably secured to outer edge 26 and lapping under lower surface 24 of frame member 20. The gasket serves to provide a continuous airtight peripheral seal under frame 10. So long as it extends below lower surface 24 and serves this function, the gasket may be formed of other materials, possess other shapes, and be secured at other locations to frame member 20.

Upright frame member 22 lends rigidity and strength to the frame and also provides attachment points for auxiliary clamps or the like which may be used to lift or pivot the frame. The upright frame member may take other forms and shapes and may be discontinuous or, under appropriate circumstances, dispensed with altogether.

Attached to frame member 20 inside the gasket area but outside of upright member 22 is a hose connector or port 30. As shown in FIG. 2, port 30 is a conventional, commercially available hose connector preferably screwed into a threaded aperture extending through frame member 20. Port 30 serves to connect the airtight chamber formed under frame 10 to an external source of pressure as more fully explained hereinafter. Depending upon the size of frame 10 and the capacity of the external pressure source, multiple ports 30 may be provided on the frame.

An additional hose connector or port 32 also in pneumatic communion with the chamber or space under frame 10 is utilized in the stencil printing phase. Port 32 and its associated aperture in frame member 20 may be added after the stencil is manufactured or simply sealed during this initial phase.

Figure 3:
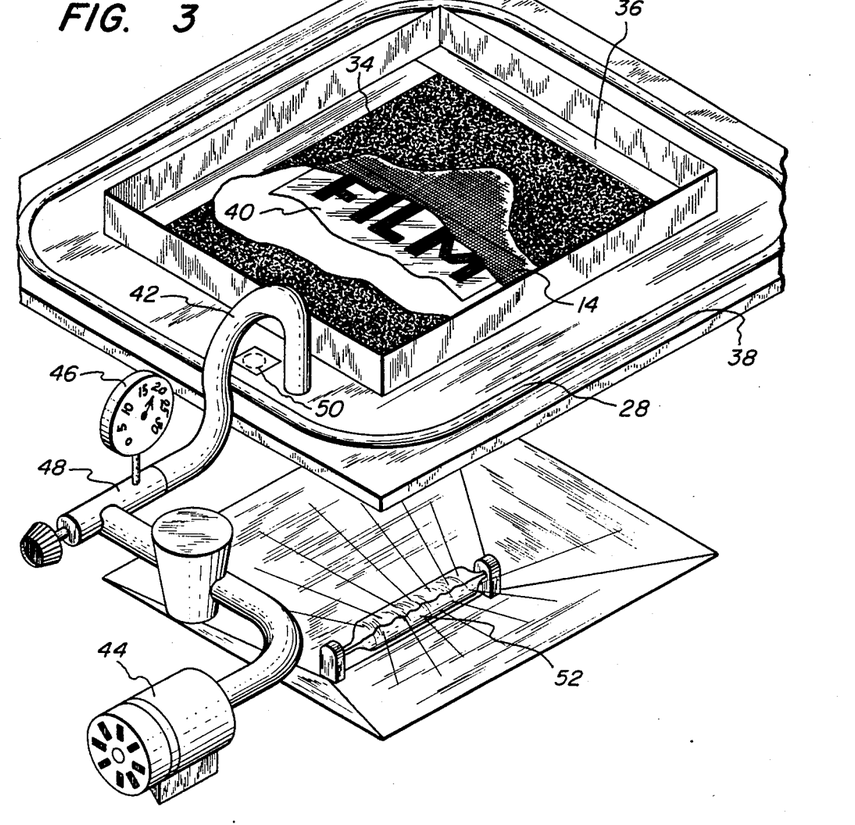
FIG. 3 is a perspective, partially cut-away view of the frame and associated equipment employed in the stencil manufacturing phase.

As generally illustrated in FIG. 3, for stencil manufacturing purposes, the stretched screen 14 (at a minimum, the image area thereof) is coated with a photosensitive emulsion 34 and any peripheral areas of the screen which remain gas pervious are sealed, for example, with tape 36. The frame is then placed on a transparent base, e.g. glass plate 38 of a photoexposure table, in such a way that an emulsion coated image area 39 of the screen overlies a film positive 40 comprising the source artwork.

Figure 4:
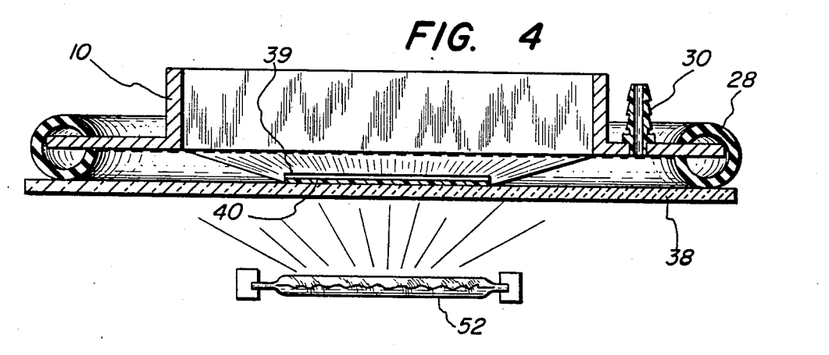
FIG. 4 is a depiction, in magnified side view, of the photostencil manufacturing process of the invention.

Hose 42 from a vacuum source or pump 44 associated with a pressure gauge 46 and a bleeder valve 48, is now attached to frame 10 via port 30 and any aperture in the frame associated with port 32 is sealed, as shown at 50. The vacuum pump is engaged and the screen is drawn down pressing against the film positive. Bleeder valve 48 is adjusted so that the draw of the screen is substantially just to the edge of film positive 40 and not excessively beyond it toward the frame, as shown in FIG. 4. This pressure is observed on gauge 46 and is noted for later use in the printing phase. The noted vacuum pressure is, of course, a measure of the deflection of screen 14 from a first plane (shown in phantom in FIG. 4) in which it is supported by frame 10, to a position in which the image area fully contacts the film positive. Gasket 28 is preferably made of low durometer material permitting the gasket to remain firmly seated during air evacuation.

With the screen in its deflected condition, the image area can be photoexposed, in conventional manner, by a light source 52. The rays from this source pass through glass plate 38 and the non-opaque areas of film positive 40 to strike contiguous portions of the screen image area. After photoexposure, the vacuum pressure under the frame is removed allowing the deflected screen to return by atmospheric pressure to its initial frame supported position. The frame supported screen is then removed from the exposure table and the image developed and dried and any necessary touch-up done to produce the desired stencil.

Figure 5:
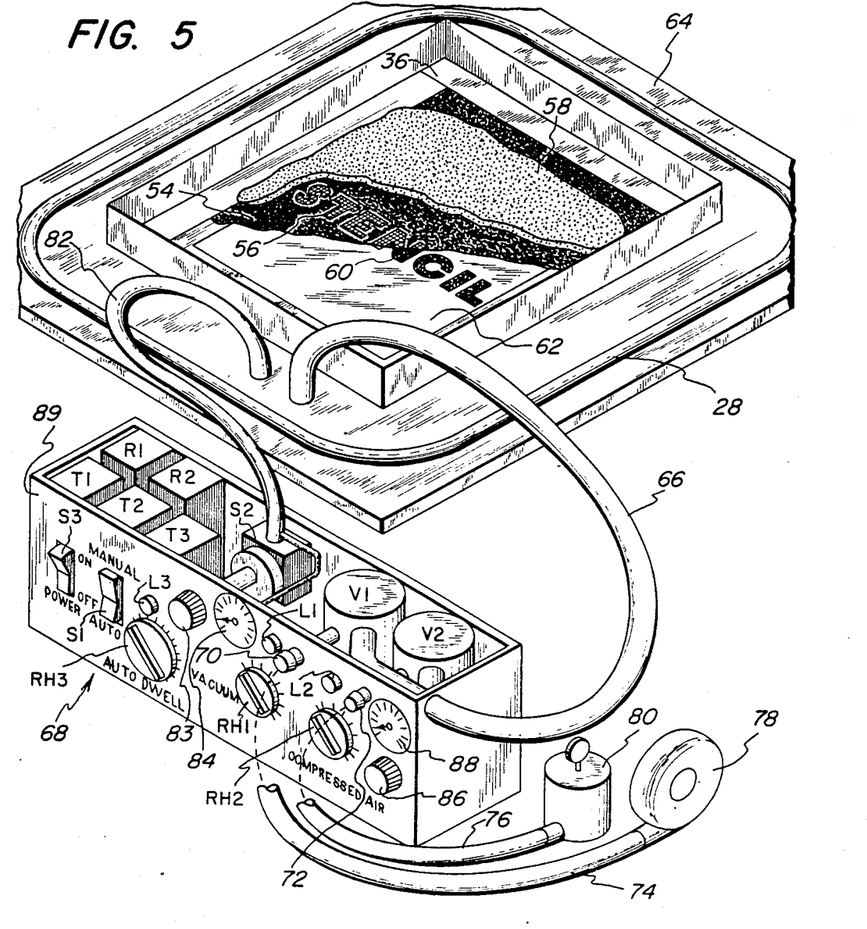
FIG. 5 is a partially cut-away view of the frame and associated control unit of the present invention employed in the stencil printing phase.
Figure 6:
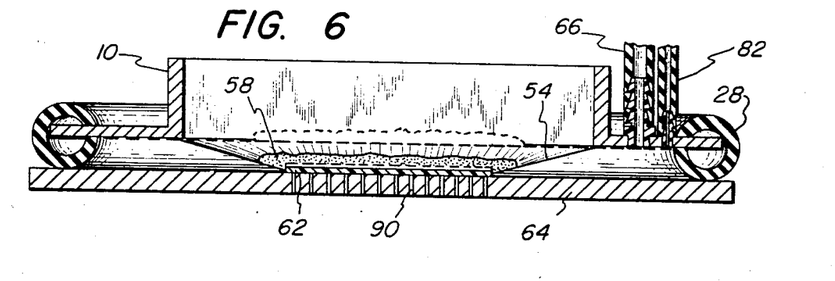
FIG. 6 is a depiction in side view of the stencil printing process of the present invention.
Figure 7:
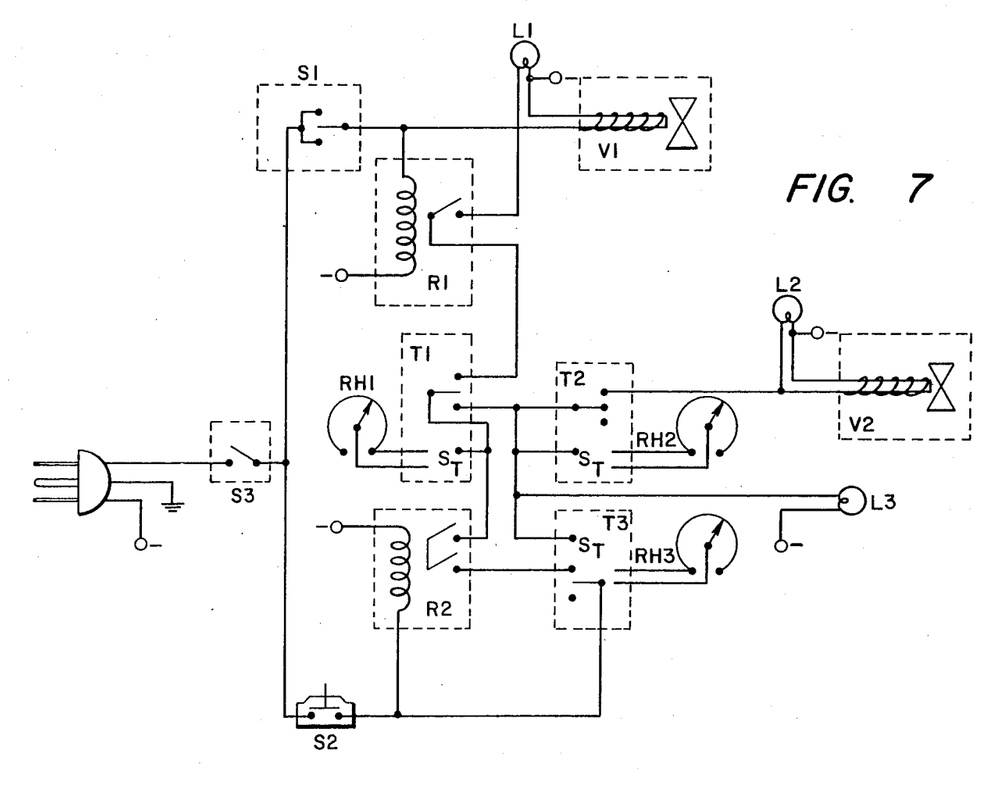
FIG. 7 is a schematic of the control unit of the present invention.

FIGS. 5-7 illustrate how the stencil mounted on the same air distribution frame is advantageously employed, according to the present invention, in the stencil printing phase.

In FIG. 5 the stencil developed from screen 14 is identified by reference character 54. The developed screen is no longer sealed to air transmission. For printing, the open pores 56 of the stencil 54 are sealed by coating them with a viscous ink 58 that is used to make the impression 60 on a substrate 62 supported on a printing table or platen 64. Substrate 62, although depicted, for illustrative purposes as a thin flat sheet may take on a different shape or form depending upon the particular application. For instance, in the electronics industry, the substrate might be a silicon or other semi-conductor wafer on which a very fine pattern of conductive material is to be deposited. Similarly, the viscous ink may comprise any one of the multitude of known compositions depending upon the particular application.

For printing purposes, frame 10 is connected by port 30 and a hose 66 to a port (not shown) of a control unit 68. The control unit is in turn connected via ports 70 and 72 and hoses 74 and 76 to a vacuum source 78 and a compressed air source 80, respectively. Port 32 connects the frame through tube 82 and a port (not shown) on control unit 68 to a vacuum sensing switch S2 within the control unit.

Control unit 68 (which is depicted with its top cover removed) is equipped with a vacuum valve V1, a compressed air pressure valve V2, and internal hoses for connecting vacuum valve V1 to port 70 and hose 66, and connecting compressed air valve V2 to port 72 and hose 66. The control unit also includes a set of three timers, T1, T2 and T3, three associated timer adjustment knobs (i.e. potentiometers) RH1, RH2 and RH3, three corresponding indicator lights, L1, L2 and L3, a master power switch S3, and a three position, mode selection switch S1. The control unit further includes a vacuum pressure adjustment knob 83 coupled to vacuum sensing switch S2 for setting this switch to a particular vacuum pressure level. Gauge 84, connected to hose 82, measures the actual vacuum pressure under frame 10. Knob 86 allows for adjustment of compressed air pressure which is measured by pressure gauge 88. As shown in FIG. 5, related knobs, lights, gauges, etc. are preferably grouped by function on control panel 89 of control unit 68. Finally, control unit 68 contains a set of relays R1 and R2 and electrical wiring. The operation of the various components of the control unit will be fully described, hereinafter, in connection with the schematic of FIG. 7.

The operation of the air distribution frame and associated control unit in the stencil printing stage is depicted in FIG. 6. As shown therein, the stencil 54, laden with ink 58, again acts as a diaphragm; this time moving the ink down to the substrate 62 to make an impression and then returning it back to its rest position (shown in phantom) after the contact. This is accomplished by alternating vacuum draw and compressed air release through the frame, via hose 66, to the gasketed, sealed area under the control of control unit 68. The same pressure used in the exposure stage is employed to deflect the stencil into contact with the substrate to print thereon.

In operation, vacuum sensor switch S2 is adjusted to detect and trigger at a pressure level equal to the reading observed during the exposure phase of the stencil manufacturing process. The substrate 62 to be printed on is secured mechanically or by means of a vacuum holddown 90 to the printing platen 64. When the stencil supporting frame 10 is lowered to seal on the printing platen, the printing cycle begins. The vacuum pressure under the stencil is measured through the sensor tube 82 and when the predetermined vacuum pressure level is reached, vacuum sensitive switch S2 activates vacuum timer T1 which is adjusted to control the deposit of ink. At the end of a first preselected period of time, the vacuum valve V1 is closed and the compresses air valve V2 is opened in time to permit entry of enough air for the rapid release of the stencil from its printing position. The compressed air induces a rapid off contact release which is important in producing a clean impression. The use of matching deflections in the stencil manufacturing and stencil printing phases and the elimination of the squeegee in the printing process overcomes the two primary sources of image distortion thereby resulting in a much more accurate reproduction of the original image.

The operation of control unit 68 will now be described with reference to the electrical schematic of FIG. 7. In general the control unit provides timed control over the compressed air pressure and vacuum used in the stencil printing phase of the present invention in both manual and automatic printing operations. The process proceeds through the following steps: the print cycle begins with a valve V1 supplying vacuum to draw down the stencil; when the predetermined vacuum pressure level is detected, a timer T1 commences timing the vacuum print interval and at its conclusion closes the vacuum valve and begins the timed duration opening of a pressure valve V2 to rapidly release the stencil from the substrate and also begins a timed duration interrupt after which the next print cycle will be allowed to begin. This last step prevents unintended repeated overprinting which would otherwise be possible with the automatic cycling. Instead, the control unit provides for a pause before the next print cycle can be initiated. It should be noted that the duration of all cycles is fully adjustable by means of timer knobs (i.e. potentiometer settings) and that the operation of each cycle is "announced" by a pilot or indicator light adjacent to the respective knob.

In the manual printing mode, the printing cycle is initiated by the operator pushing a spring loaded momentary switch; in automatic operation, the sealing of the stencil frame bottom gasket and the appearance of vacuum initiates the process. A detailed explanation of the operation of the control unit follows.

The circuits in the control unit are energized by turning master power control switch S3 on. A second switch S1, which is a single-pole, double-throw type switch with a center-off position, is then activated. When switch S1 is deflected to its upper momentary contact position, the manual printing process begins. Depression of switch S1 to its lower maintained contact position initiates the automatic printing process. In either event, relay R1 closes and feeds power to the vacuum valve V1 which opens and admits vacuum to the sealed chamber under the frame. As soon as vacuum sensing switch S2 detects the preselected vacuum pressure level, it closes and passes power to vacuum valve V1, which because of the circuitry back-feeding power to the coil of relay R1 locks it and power to the vacuum valve on. Power is also fed to timer T1, the vacuum cycle length timer, i.e. to both this timers relay's common pole and to its "start timing" ($S_T$) cycle connection.

Timer T1 now begins timing how long the vacuum valve is to be opened. It should be understood that timer T1 does not initiate any action until the cycle time has elapsed. When the cycle duration has elapsed, the coil of timer T1's internal relay is energized and three things are effectuated:

1. Power to relay R1's contacts and coil and thus to the vacuum valve V1 is interrupted, thereby terminating the vacuum supply to the frame.
2. Power is now supplied to timer T2, the pressure cycle length timer; this does two things:
   a. begins supplying power to the pressure valve V2 (thus opening the valve and flushing the space under the stencil with positive pressure to lift the stencil off the substrate) and
   b. begins timing how long the pressure valve will be energized.
3. Power is supplied to the "start timing terminal" of timer T3, the interrupt duration cycle timer, which times how long it will be before another printing cycle is allowed to be initiated. This interrupt is achieved by running relay R2's coil power lock through the NC contacts of the relay in timer T3. When timer T3's cycle elapses, its relay operates and those contacts break, deenergizing relay R2, which resets all circuits. A new cycle may now be initiated.

For manual operation, the interrupt duration timer T3 is set arbitrarily long enough to allow the printer to make the print and get the screen back up. In automatic printing, the interrupt duration timer is set to allow recycle just before the printing machinery would be setting the stencil down upon a replacement substrate.

Pilot lights L1, L2 and L3 indicate respectively the operation of the vacuum valve timer T1, compressor valve timer T2 and interrupt cycle timer T3. Associated with each timer T1, T2 and T3 are potentiometers RH1, RH2 and RH3 respectively which allow for duration adjustment. Potentiometers RH1 and RH2 might typically have a value of 0-750 K ohms while potentiometer RH3 preferably has a range of 0-2.4 M ohms. Relay R2 and each of timers T1, T2 and T3 contains a double-pole, double-throw relay. Relay R1 preferably comprises a single-pole, single-throw relay. Vacuum sensor switch S2 is preferable a single-pole, single-throw, adjustable, pressure differential type switch which closes on sensing the desired vacuum pressure level. A gauge-cum-switch (such as a Dwyer Photohelic) may be substituted for this switch. The gauge-cum-switch unit has two double-pole, double-throw relays; one could be used as a low-vacuum event switch to feed lock-in power to relay R1 through the common pole of timer T1's internal relay, while the other could be a high-vacuum event switch to feed timer: T1's "start timing terminal" to initiate the timing cycle. Other modifications and variations in the control unit circuitry and pneumatic subsystem will suggest themselves to those skilled in this technology.

To assure complete accuracy and controlled layering of the printed impression, the amount of time the stencil contacts the material to be printed and the speed of release of the stencil from the printed substrate must be precisely timed. It is also necessary to limit the pressure of the vacuum used in printing to the same draw that was used in photostencil manufacture. These functions are all regulated by the control unit just described.

A detailed description of the total stencil manufacturing and printing process, of the present invention, will now be presented.

After the image to be printed has been assessed for definition and layering requirements, an air distribution frame, as described, is constructed proportionate to the image area dimensions. Holes are drilled through the frame for the hose connector(s) and a screen fabric of the specification required is stretched and adhered to the frame. A special finishing process is then, preferably, utilized to coat the photosensitive emulsion on this screen.

In this process, the bottom of the screen is coated with a thick layer of "direct" emulsion using a soft, rounded squeegee. This layer is dried and then an additional layer is applied to the same side using the same squeegee. Immediately, while this layer is still wet, the screen is placed, wet face down on a clean smooth sheet of polycarbonate or other non-hydroscopic material and the squeegee is run over the back of the screen laminating the sheet of non-hydroscopic material to the screen bottom. When the screen is dry, the sheet of non-hydroscopic material is removed leaving a screen that is highly flexible and durable with the contact surface perfectly smooth and polished. This coating procedure assures that the emulsion layer is of a controlled thickness, the contact surface is of a quality that produces high definition and the strength of the emulsion hold to the screen is adequate for an extended production life.

This photosensitive screen is then prepared for exposure. Any screen portions between the emulsion and the frame that are still open to air transmission are securely coated or taped. The outside edge of the frame is banded with the peripheral gasket which can be sealed to the frame's upper side and allowed to lip freely around the underside. A hose connector is mounted in one of the holes through the frame and the other (vacuum sensor) hole is sealed. The frame is now fully functional for the exposure phase of the process.

A clean sheet of glass slightly larger than the frame is chosen. If the material to be printed on is to be dimensionally higher than the printing platen, this thickness in clear material is added to the glass and the film positive of the image is positioned on it. The frame is then centered over the film positive on the glass and a hose from the vacuum pump, with associated pressure gauge and bleeder valve, is attached to the frame. The vacuum pump is then engaged and the screen is drawn down to press against the film positive. The bleeder valve is adjusted so that the draw of the screen is substantially just to the edge of the film positive. This pressure is observed on the gauge and noted for later use in the printing stage. The complete unit: frame with deflected screen, film positive and glass is then placed facing a light source and the image is exposed.

After the image on the screen is developed, dried and any necessary touch-up done, the frame is connected by a hose connection and sensor tube connection to the control unit. The stencil is now ready for printing.

The developed stencil is no longer sealed to air transmission. For printing, the open pores in the image area are sealed by coating them with ink. The stencil, ladened with ink, is placed over a substrate on a printing platen and a vacuum equal to that employed in the photoexposure phase is created under the stencil. Atmospheric pressure deflects the stencil to contact and transfer ink to the substrate. After a first preselected time period, the vacuum is replaced by compressed air to rapidly release the screen from its printing position. The compressed air is activated for a second preselected time period at the close of which a time duration interrupt occurs to permit substrate replacement.

It will thus be apparent that the present invention provides a solution to the distortion problems associated up until now with "silk screen" printing and facilitates such printing with a speed and accuracy heretofore unobtainable. With the present invention, images having lines as fine as 25-30 microns wide and spaces between the lines on the order of 45 microns can be accurately reproduced. The present invention is thus particularly beneficial to the electronics industry and other applications requiring fine printing, close tolerances or minimal distortion.

Although the invention has been described in terms of its presently preferred embodiment, modifications, substitutions and variations may be made within the scope of the invention as defined by the appended claims.

What I claim is:

1. In a method for perparing and printing with a stencil, wherein a screen mounted on a frame and coated with a photo-sensitive emulsion is brought into contact with a film positive, photoexposed, developed, and the resulting frame-mounted stencil is ladened with ink and brought into contact with a substrate to be printed upon, the improvement comprising the steps of:
   vacuum deflecting to a selected variable extent the screen coated with a photo-sensitive emulsion into contact with the film positive for photoexposure while peripherally supporting the screen at a set distance from a plane containing the film positive;
   obtaining a precise measure of said selected variable extent of screen deflection; and
   peripherally supporting the stencil ladened with ink at the same set distance from a plane containing the substrate to be printed upon while controllably deflecting the stencil into contact with said substrate for printing by vacuum deflecting the stencil to a detected extent equal to said selected extent of screen deflection, whereby printing distortion is reduced.

2. The improved method of claim 1 wherein screen deflection for photoexposure and stencil deflection for printing are induced through common means.

3. The improved method of claim 2 wherein the screen deflection for photoexposure and stencil deflection for printing are induced through the same screen/-stencil mounting frame.

4. The improved method of claim 3 wherein:
   the screen is peripherally supported for photoexposure by a peripheral substantially unyielding gasket attached to the frame, said gasket creating an airtight chamber between the screen and the plane of the film positive;
   the screen is deflected by reducing the barometric pressure in said chamber below atmospheric pressure;
   the measure of the selected extent of screen deflection comprises a particular partial vacuum pressure reading between atmospheric pressure and absolute vacuum; and
   the stencil is also peripherally supported by said frame attached gasket and is deflected to an equal extent for printing by reducing the barometric pressure between the stencil and the substrate and sensing when said particular partial vacuum pressure reading is reached.

5. The improved methof of claim 4 further comprising the step of inducing a rapid release of the stencil from the substrate when printing is completed.

6. The improved method of claim 5 wherein the step of inducing said rapid release comprises introducing a controlled amount of compressed air between said stencil and substrate.

7. The improved method of claim 6 wherein the compressed air is introduced through said frame, and the reduced barometric pressure between the stencil and the substrate is automatically sensed through said frame.

8. The improved method of claim 7 further comprising the steps of:
   maintaining the stencil in its deflected condition for a preselected adjustable period of time to control the deposit of ink on the substrate; and
   maintaining the introduction of compressed air for a preselected adjustable period of time to control the rapidity of release of the stencil from the substrate.

9. The improved method of claim 1 further comprising the step of providing a smooth surface on the underside of the photoemulsion coated screen prior to screen deflection.

10. The improved method of claim 9 wherein said smooth surface is provided by:
    applying a coating of emulsion to the underside of the screen, laminating a smooth sheet of non-hydroscopic material to said coating, allowing the coating to dry and then peeling off the sheet of non-hydroscopic material.

11. The improved method of claim 1 wherein the screen is deflected to draw the screen substantially just to an observed outer edge of an image on the film positive.

12. A squeegee-less method of printing with an ink laden frame supported stencil on a substrate, the stencil having been manufactured by a photoexposure process which includes a step of vacuum deflecting, at a particular variable partial vacuum pressure, a portion of a frame supported screen into contact with a film positive while maintaining the periphery of the screen a set distance away from a plane containing the film positive, the method comprising the steps of:
    ascertaining the particular partial vacuum pressure used in the manufacture of the stencil;
    securing a substrate on a supporting surface;
    applying ink over openings on the backside of said stencil;
    locating the ink bearing stencil so that a contact surface of the stencil is positioned to face said substrate and the periphery of the stencil is maintined said set distance away from a plane containing the substrate by gasket means creating an airtight chamber between the stencil and the plane containing the substrate;
    vacuum deflecting the stencil to bring its contact surface into contact with said substrate by reducing the air pressure in said chamber to a detected level substantially identical to the particular partial vacuum pressure used in the manufacture of the stencil;
    vacuum depositing ink from the so deflected stencil onto the contacted substrate for a preselected period of time; and rapidly releasing the stencil from contact with the substrate by introducing a controlled amount of compressed air into said chamber.

13. The method of claim 12 wherein:
the air pressure in said chamber is reduced by exhausting air through the stencil supporting frame and is increased by introducing said controlled amount of compressed air through said frame; and
the particular vacuum pressure used in the manufacture of the stencil comprises a vacuum pressure which deflects an image area of the screen into full contact with an image on said film positive without drawing said screen substantially beyond the outer edge of said film positive image.

14. The method of claim 13 further comprising the steps of automatically detecting when said reduced air pressure level in said chamber reaches the particular partial vacuum pressure, and, in response to said detection, automatically and sequentially cycling through said vacuum depositing and rapid releasing steps for preselected adjustable periods of time.

15. The method of claim 14 wherein prints of said stencil are made on multiple substrates, and further including the step of automatically interrupting the printing process after the rapid releasing step for a time period sufficient to allow substrate replacement.

16. A method of precisely integrating stencil manufacture and printing to reduce print distortion, comprising the steps of:
peripherally supporting a screen coated with photosensitive emulsion in a particular geometric relationship with respect to a film positive, treating said screen as a variably deflective contact diaphragm and vacuum deflecting said screen to a selected extent to contact said film positive during photoexposure;
obtaining a precise measure of said selected extent of screen deflection;
developing said screen into a corresponding stencil; and
peripherally supporting said stencil in the same particular geometric relationship with respect to a substrate to be printed upon, applying ink to said stencil, treating said stencil as a variably deflective contact diaphragm and vacuum deflecting the stencil ladened with ink into contact with said substrate to a detectdd extent equal to said selected extent of screen deflection, whereby printing distortion is reduced.

17. In a method of photographic stencil production and stencil printing, the improvement comprising the use for both stencil production and stencil printing of a common air distribution frame including a variably defective diaphragm membrane supported a precise distance above a second plane by a peripheral unyielding seal, said seal creating an airtight chamber of a given magnitude between said membrane and said second plane, said membrane comprising a screen coated with a photosensitive emulsion and said second plane containing a film positive for stencil production, said membrane conprising a stencil ladened with ink and said second containing a substrate to be printed upon for stencil printing, said frame facilitating the controlled evacuation of atmospheric pressure from said chamber so that said membrane is vacuum deflected to a selected variable extent into contact with said second plane, and facilitating sensing of a precise level of evacuated pressure within said chamber.

18. The improved method of claim 17 further comprising the step of ascertaining a precise setting of evacuated pressure within said chamber during stencil production and reproducing said precise setting in said chamber during stencil printing, whereby an image on the film positive can be printed with exact dimensional characteristics on said substrate.

19. The improved method of claim 18 wherein said precise setting comprises a percentage of absolute vacuum, and further comprising the use of a variable pressure sensor connected to said air distribution frame for accurately determining when said precise setting is reached during stencil printing, and signalling the termination of the evacuation of atmospheric pressure from said chamber and sequential activation of rapid stencil release by controlled air introduction into said chamber through said frame.

20. The improved method of claim 19 further comprising the steps of electronically controlling the atmospheric pressure in said chamber during printing to maintain said precise setting for a period of time needed to satisfy specific ink transfer requirements for printing of a desired image on said substrate and automatically activating said rapid stencil release upon completion of said period of time.

* * * * *